(12) United States Patent
Song et al.

(10) Patent No.: US 6,635,532 B2
(45) Date of Patent: Oct. 21, 2003

(54) METHOD FOR FABRICATING NOR TYPE FLASH MEMORY DEVICE

(75) Inventors: Yun-Heub Song, Kyunggi-do (KR); Woon-Kyung Lee, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/099,126

(22) Filed: Mar. 15, 2002

(65) Prior Publication Data

US 2002/0132425 A1 Sep. 19, 2002

(30) Foreign Application Priority Data

Mar. 16, 2001 (KR) .......................... 2001-13618

(51) Int. Cl.[7] .......................................... H01L 21/8247
(52) U.S. Cl. ...................... 438/259; 438/263; 438/524
(58) Field of Search ................... 438/201, 211, 438/258, 259, 263, 264, 302, 524, 525

(56) References Cited

U.S. PATENT DOCUMENTS 5,661,057 A * 8/1997 Fujiwara ..................... 438/264
5,736,442 A * 4/1998 Mori ........................... 438/257

* cited by examiner

Primary Examiner—Chandra Chaudhari
(74) Attorney, Agent, or Firm—Marger Johnson & McCollom P.C.

(57) ABSTRACT

Disclosed is a method for fabricating a NOR flash memory device where a buried common source line made of an impurity diffusion layer has an even surface or a lower step difference. The method includes forming adjacent isolation layers that define an active region there between within a semiconductor substrate. Then, a floating gate pattern is formed overlying the active region. An inter-gate dielectric film and a control gate film are sequentially formed overlying the floating gate pattern. The control gate film, the inter-gate dielectric film, and the floating gate pattern are sequentially patterned, thereby forming a plurality of word lines extending across the active region. The active region between the adjacent isolation layers and the isolation layers are removed, adjacent to one sidewall of the word lines, thereby forming a common source line region. Next, impurities are implanted into the common source line region, thereby forming a common source line made of an impurity diffusion layer.

17 Claims, 12 Drawing Sheets

METHOD FOR FABRICATING NOR TYPE FLASH MEMORY DEVICE

This application relies for priority upon Korean Patent Application No. 2001-13618, filed on Mar. 16, 2001, the contents of which are herein incorporated by reference in their entirety.

BACKGROUND OF THE INVENTION

1. Field of the Invention

The present invention generally relates to a method for fabricating a semiconductor memory device and, more particularly, to a method for fabricating a NOR type flash memory device.

2. Description of the Related Art

As is known, much effort is being spent on reducing the sizes of semiconductor memory devices. In case of a NOR type flash memory (referred to a 'NOR flash memory' hereinafter), one approach used to reduce the device size is to form buried common source lines made of an impurity diffusion layer, self-aligned with word lines. However, as the semiconductor devices become high integrated, the width of the common source line is inevitably decreased, undesirably resulting in an increase of parasitic resistance in the buried common source line. Furthermore, if a trench isolation technique is used in place of a local oxidation of silicon (LOCOS) to avoid problems such as bird's beak encroachment in field oxide layers, the sidewalls of the isolation trenches have vertical sidewall profiles relative to a surface of the semiconductor substrate. Thus, when the semiconductor substrate is exposed to form the common source line after removing the field oxide layer between source regions of cell transistors, the area of the exposed trench sidewalls is increased. As a result, it is difficult to reduce the resistance of the common source line because impurity diffusion layers formed on the exposed sidewalls in the semiconductor substrate are too shallow as shown in FIG. 2A.

FIG. 1 is a layout diagram of part of a cell array of a conventional NOR flash memory cell. FIGS. 2A and 2B are schematic cross-sectional views showing the conventional NOR flash memory cell structure, taken along the line I–I', and the line II–II' of the pattern shown in FIG. 1, respectively.

In FIGS. 2A through 11B, a reference mark A shows a cross-sectional view of word lines, and B shows a cross-sectional view of a common source line, taken along the line I–I' shown in FIG. 1. A reference mark C shows a cross-sectional view of active regions disposed between the word lines, and D shows a cross-sectional view of the word lines formed on top of a field oxide layer, taken along the line II–II'.

Referring to FIG. 1, the conventional NOR flash memory cell structure defines active regions by an isolation layer such as a field oxide layer 105 disposed along one direction on the semiconductor substrate. A plurality of word lines WL overlying floating gate patterns are arranged in parallel with each other in the active region extending across the field oxide layer 105. Further, drain and source regions are formed along the sides of the respective word lines WL. The source regions form a common source line 113 where the field oxide layers between the source regions of the word lines WL are removed and thus the semiconductor substrate is exposed along the word lines WL. A bit line 118 for connecting a peripheral circuit or external power supply is electrically connected to a drain region 114 through a bit line plug 117.

Referring to FIGS. 2A and 2B, the surface of a common source line 213a of the conventional NOR flash memory cell has severely stepped sidewalls 212. Thus, if the impurity diffusion layer is formed on the exposed sidewalls 212 to form a common source line 213a using conventional ion-implantation techniques, it is difficult to reduce the electrical resistance of the common source line due to a shallow depth of the impurity diffusion layer formed on the stepped sidewalls 212 (the common source line 213a). As a result, device characteristics of the flash memory cell as well as a uniformity of characteristics in each region of a cell array can be degraded. It may be possible to reduce the resistance of the common source line 213a by forming the impurity diffusion layer on the sidewalls 212 of the trench region through an oblique ion-implantation that is recently introduced. However, even with this oblique ion-implantation technique, there is a limit to reduce the resistance of the common source line because the surface of the substrate having exposed sidewalls 212 is quite uneven as illustrated in FIG. 2A.

SUMMARY OF THE INVENTION

The present invention provides a method for fabricating a flash memory device overcoming the problems discussed.

Accordingly, a method for fabricating a NOR type flash memory device includes forming a field oxide layer and concurrently defining a plurality of active regions in a semiconductor substrate. A floating gate pattern is formed in the active regions, and then an inter-gate dielectric film, a control gate film, and a capping insulating film are formed over the resultant structure where the floating gate pattern is formed. The capping insulating film, the control gate film, the inter-gate dielectric film, and the floating gate pattern are sequentially etched, and thus a plurality of word lines are formed across the active regions. A common source line region is formed by etching an exposed semiconductor substrate and the field oxide layer along one sidewall of the respective word lines. In the common source line region and the active region exposed along the other sidewall of the word lines, impurities are implanted by an ion-implantation method, and thus a common source line and a drain region are formed.

The common source line region is self-aligned with the wordline, and is formed by etching the semiconductor substrate exposed along one sidewall of the respective word lines and then etching the field oxide layer.

The foregoing features and advantages of the invention will be more fully described in the accompanying drawings.

BRIEF DESCRIPTION OF THE DRAWINGS

The above and other objects, features and advantages of the present invention will become more apparent from the following detailed description when taken in conjunction with the accompanying drawings in which:

FIGS. 3A through 11A are cross-sectional views illustrating various stages of processing steps for fabricating NOR flash memory devices, taken along the line I–I' shown in FIG. 1, according to an embodiment of the present invention;

FIGS. 3B through 11B are cross-sectional views illustrating processing steps for fabricating NOR flash memory devices, taken along the line II–II' shown in FIG. 1, according to an embodiment of the present invention.

DESCRIPTION OF THE PREFERRED EMBODIMENTS

In the following description for purposes of explanation, specific numbers, materials and configurations are set forth in order to provide a thorough understanding of the present invention. However, it will be apparent to one skilled in the art that the present invention may be practiced without the specific without the specific details. In other instances, well-known systems are shown in diagrammatic or block diagram form in order not to obscure the present invention.

Figure 1:
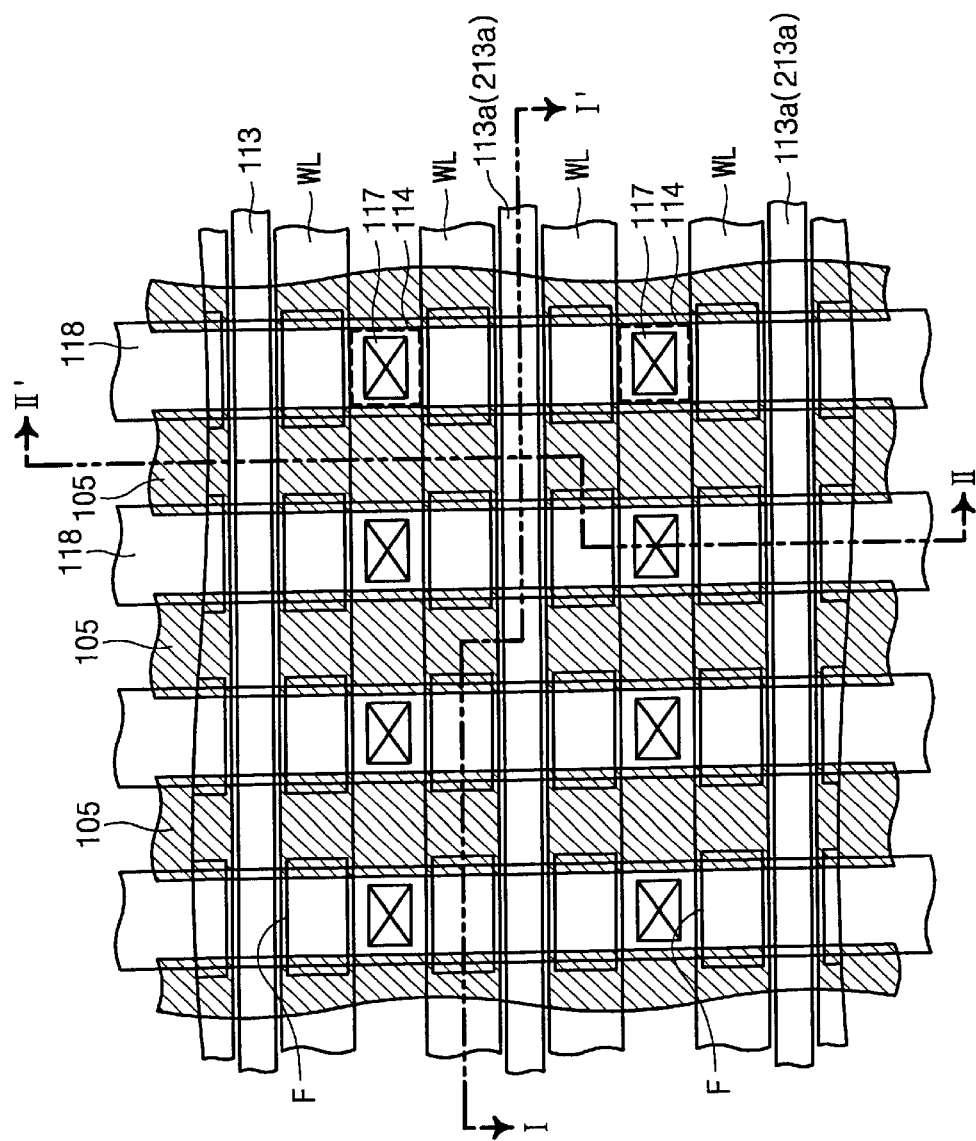
FIG. 1 is a layout diagram of part of a cell array of a conventional NOR flash memory device.
Figure 2A:
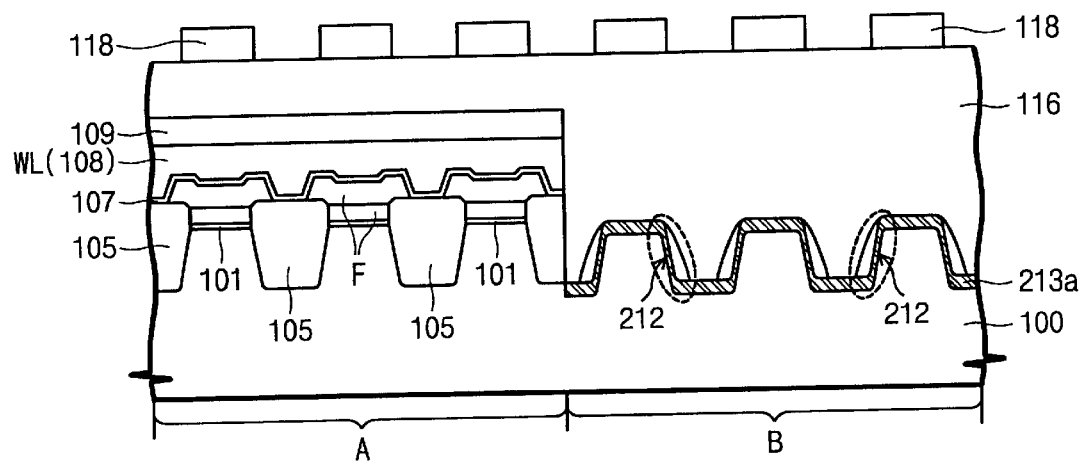
FIGS. 2A and 2B are cross-sectional views of the conventional NOR flash memory device, taken along the line I–I', and the line II–II' of the pattern shown in FIG. 1, respectively.
Figure 2B:
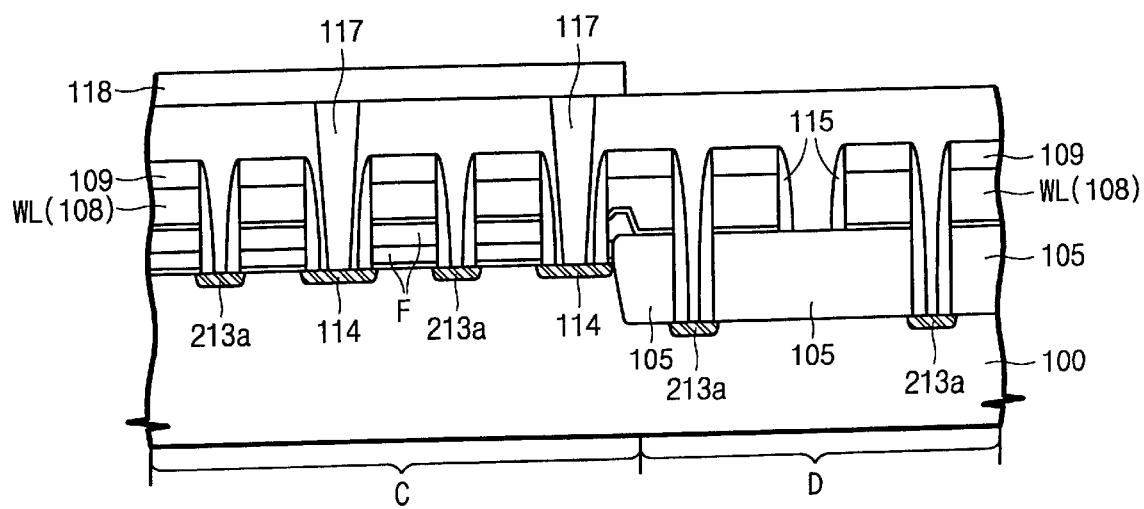

FIGS. 3A through 11A are cross-sectional views illustrating various stages of processing steps for fabricating a flash memory device according to an embodiment of the present invention, taken along the line I–I' shown in FIG. 1. FIGS. 3B through 11B are cross-sectional views illustrating processing steps for explaining an embodiment of the present invention, taken along the line II–II' shown in FIG. 1.

As discussed above, a reference mark A shows a cross-sectional view of word lines, and B shows a cross-sectional view of a common source line, taken along the line I–I' shown in FIG. 1. A reference mark C shows a cross-sectional view of active regions disposed between the word lines, and D shows a cross-sectional view of the word lines formed on a field oxide layer, taken along the line II–II' shown in FIG. 1.

Figure 3A:
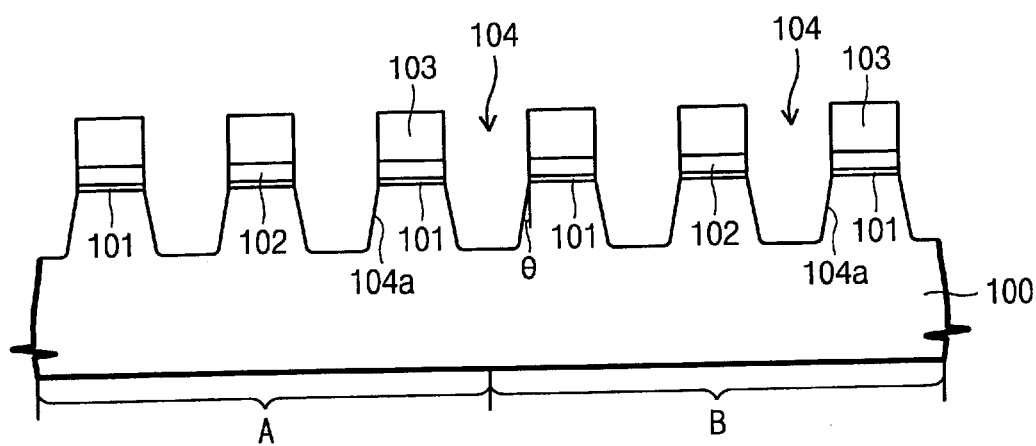
Figure 3B:
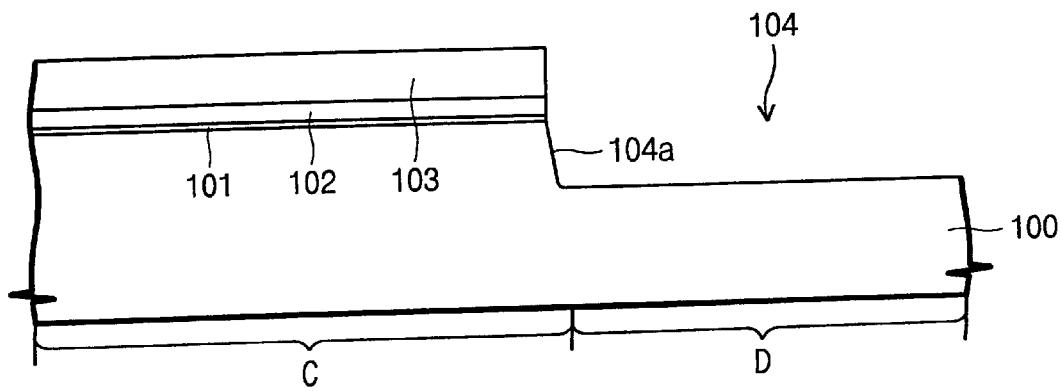

Referring to FIGS. 3A and 3B, a trench region 104 is formed concurrently with formation of active regions in a semiconductor substrate 100. A tunnel oxide layer 101, a lower floating gate pattern 102, and a CMP stop layer pattern 103 are formed in the active region.

Specifically, the tunnel oxide layer 101, a lower floating gate film, and a CMP stop layer are sequentially formed on the semiconductor substrate 100. Then, the CMP stop layer, the lower floating gate film, the tunnel oxide layer 101, and the semiconductor substrate 100 are etched to form the trench region 104.

It is preferable that a sidewall 104a of the trench region 104 be formed to have an oblique angle (θ) of 15°~25° in order to enhance an impurity density of the impurity diffusion layer when forming a source diffusion layer thereafter. Further, it is preferable that the trench region 104 have a depth preventing active regions adjacent thereto from being electrically shorted, e.g., a depth of 2000 Å~4000 Å by etching the semiconductor substrate 100. It is preferable that the lower floating gate film be made of a conductive material, e.g., a doped polysilicon film. Other suitable methods can be used. For example, the lower floating gate film can be an undoped polysilicon film, and is then made sufficiently conductive by diffusing impurities from an upper floating gate film to be formed thereon.

Figure 4A:
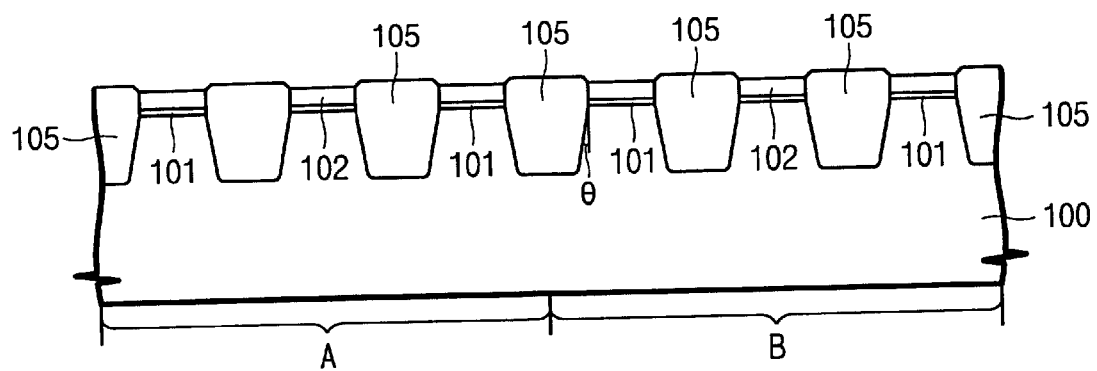
Figure 4B:
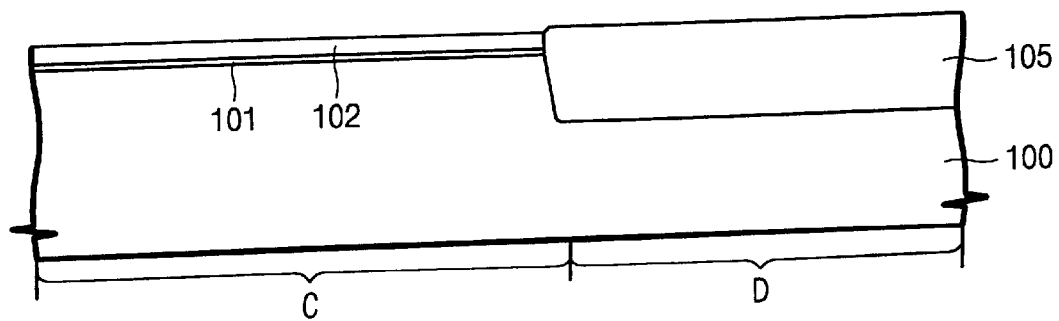

Referring to FIGS. 4A and 4B, the trench region 104 is filled with an insulation material. Then, the insulation material is planarized until the top surface of the CMP stop layer pattern 103 is exposed. Next, the CMP stop pattern 103 is removed. Thus, the top surface of the lower floating gate pattern 102 is exposed. Consequently, a field oxide layer 105 is formed within the trench region 104. Thus, the field oxide layer 105 is formed self-aligned with the lower floating gate pattern 102. Here, it is possible to recess the top surface of the planarized insulation material layer, prior to removing the CMP stop pattern 103. This prevents a conductive film from remaining along the boundary of the field oxide layer 105 and the semiconductor substrate 100 between word lines during the formation of the word lines.

It is preferable to form the insulation material layer with a material having a good gap-fill capability and capable of avoiding void generation in the narrow trench region 104. For example, $O_3$-TEOS (tetraethyl orthosilicate) oxidation film or HDP (high density plasma) CVD (chemical vapor deposition) oxidation film may be used. In addition, in order to cure damage to the semiconductor substrate 100 generated during the formation of the trench region 104, and to improve an interface characteristics between the field oxide layer 105 and the semiconductor substrate 100, it is preferable to form an additional thermal oxidation film on the semiconductor substrate 100 exposed in the trench region 104.

Consequently, during the formation of the field oxide layer 105, an oblique angle (θ) of the sidewall in the trench region is formed in the range of 15°~30°. It results from higher contact frequency of the upper trench sidewall with oxygen than the bottom trench sidewall in the semiconductor substrate during an annealing process and a process for forming the insulating material layer.

Figure 5A:
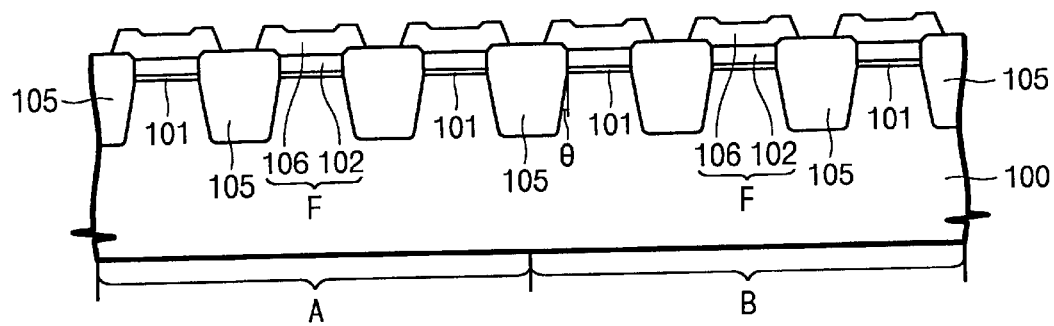
Figure 5B:
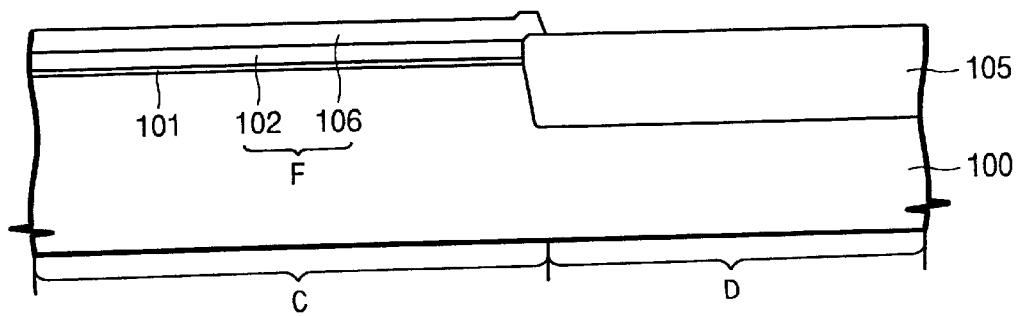

Referring to FIGS. 5A and 5B, an upper floating gate pattern 106 is formed on the lower floating gate pattern 102. As a result, a floating gate pattern F overlapped with the edges of the pair of field oxide layers 105 is formed. Also, a tunnel oxide film 101 is interposed between the pattern F and the active region.

More specifically, the upper floating gate pattern 106 is formed by forming an upper floating gate film on the lower floating gate pattern 102, and then patterning the upper floating gate film to expose the field oxide layer 105. It is preferable that the upper floating gate film be a conductive material layer, e.g., a doped polysilicon layer. If the lower floating gate pattern 102 is formed with an undoped polysilicon, the lower floating gate pattern 102 becomes conductive with the impurities diffused from the upper polysilicon layer during the formation of the upper floating gate film.

Figure 6A:
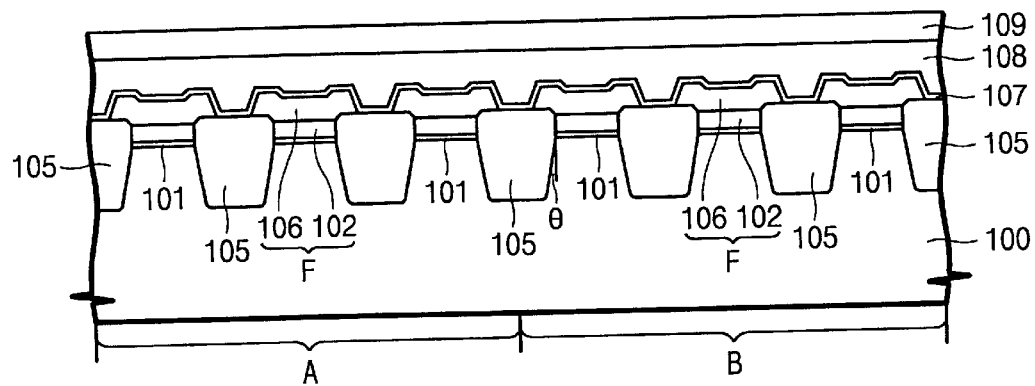
Figure 6B:
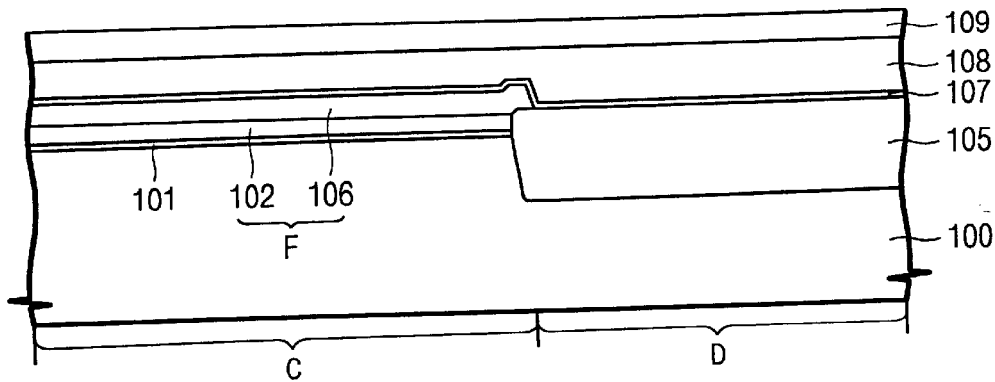

Referring to FIGS. 6A and 6B, an inter-gate dielectric film 107, a control gate film 108, and a capping insulating film 109 are formed overlying the floating gate pattern F. It is preferable to form the inter-gate dielectric film 107 with a material having a high permittivity and a high break down voltage, e.g., ONO (oxide-nitride-oxide) film.

The control gate film 108 is made of a conductive material. For example, the control gate film 108 is preferably a doped polysilicon film or to a stack structure including a doped polysilicon film and a metal silicide film formed thereon. It is preferable that the capping insulating film 109 be made of a material having a good etch selectivity with respect to the semiconductor substrate 100, or the semiconductor substrate 100 and the field oxide layer 105, e.g., an oxide layer or a silicon nitride film.

Figure 7A:
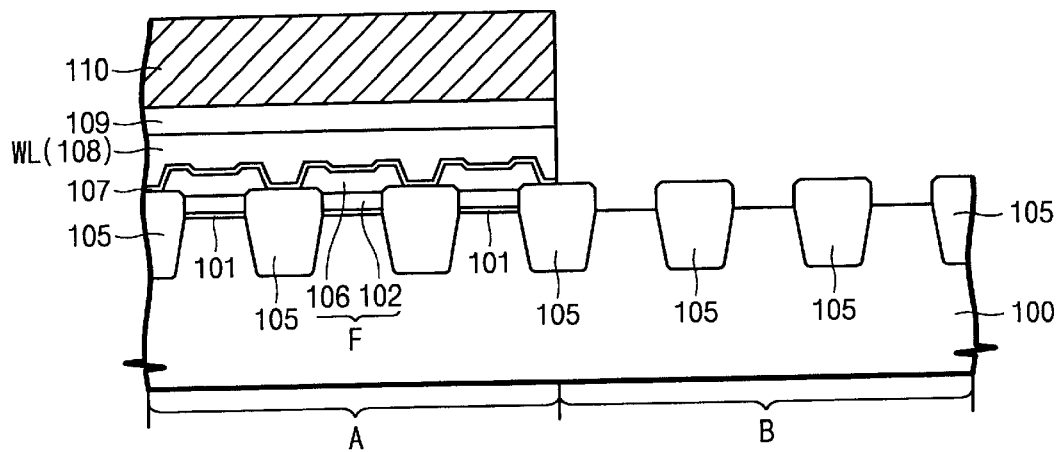
Figure 7B:
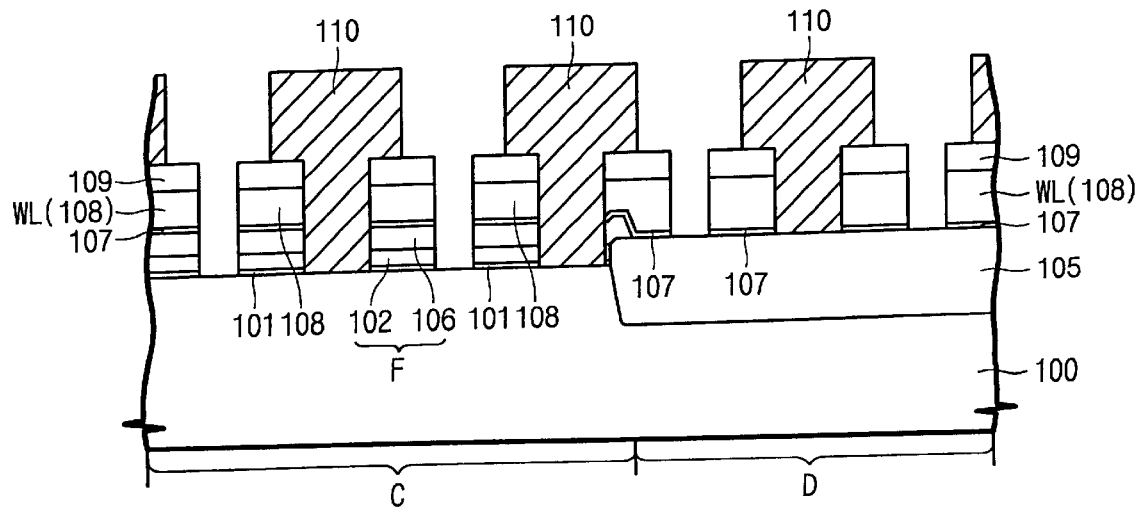

Referring to FIGS. 7A and 7B, a plurality of word lines WL are formed in parallel with each other extending across the field oxide layer 105. Particularly, the word lines WL are formed by sequentially patterning the capping insulating film 109, the control gate film 108, the inter-gate dielectric film 107, and the floating gate pattern F.

A photo resist pattern 110 exposing the active region and the field oxide layer 105 along one sidewall of the respective word lines WL is formed overlying the word lines WL. It is preferable to form the photo resist pattern 110 exposing an edge of the top of one of the word lines WL, in order to prevent the active region and the field oxide layer 105 from being partially covered along the one sidewall of the respective word lines WL due to mis-alignment during a photolithography process.

Figure 8A:
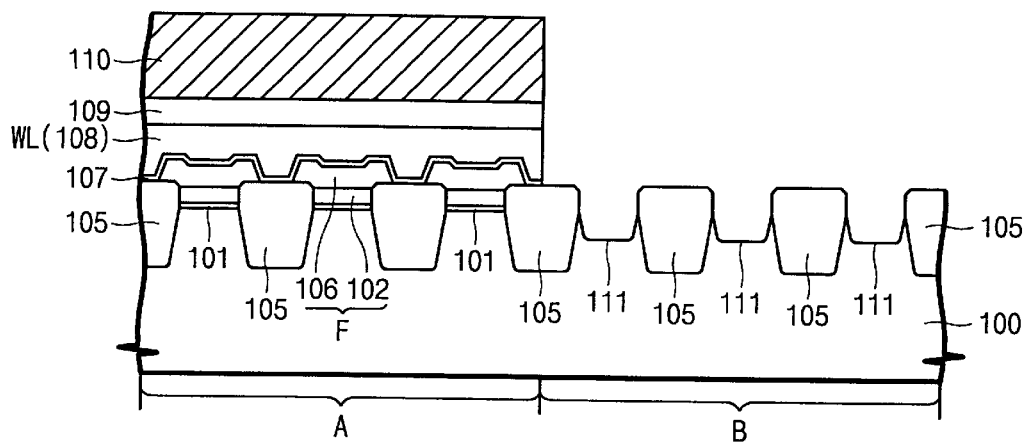
Figure 8B:
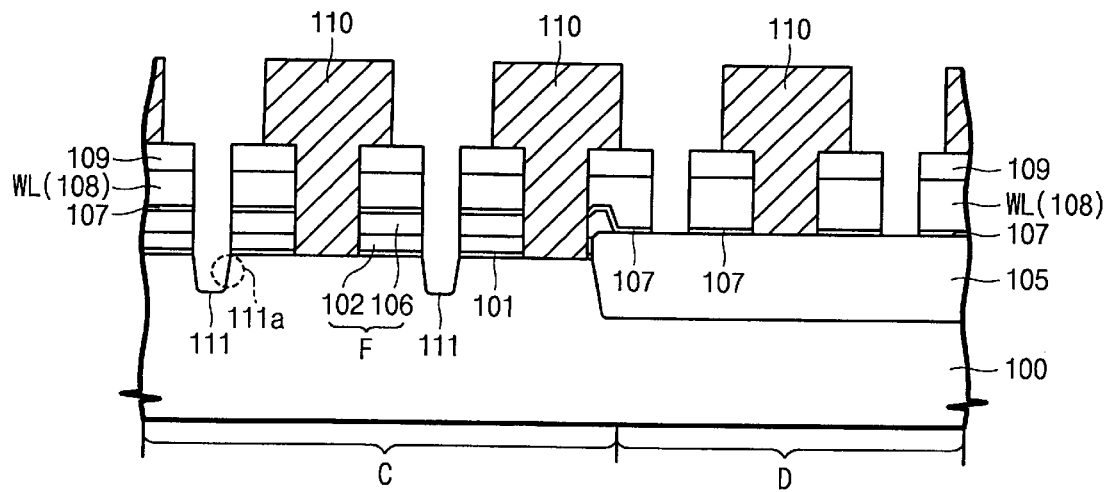

Referring to FIGS. 8A and 8B, a source trench 111 is formed by etching the semiconductor substrate 100 in the active region being exposed along the one sidewall of the respective word lines WL, using the photo resist pattern 110, the word lines WL, and the field oxide layer 105 as an etch mask. Here, it is preferable to etch the semiconductor substrate 100 to a depth of 500 Å through 2000 Å, in order for the source trench 111 to have substantially the same depth as that of the field oxide layer 105, or to a depth producing a smaller step difference with the field oxide layer 105. Further, to increase a surface area of the common source line, it is preferable that a sidewall 111a of the source trench 111 be etched to be inclined along the sidewall of the wordline WL. Here, the capping insulating film 109 serves to prevent the word lines WL from being etched in a process of forming the source trench 111 by etching the semiconductor substrate 100.

Figure 9A:
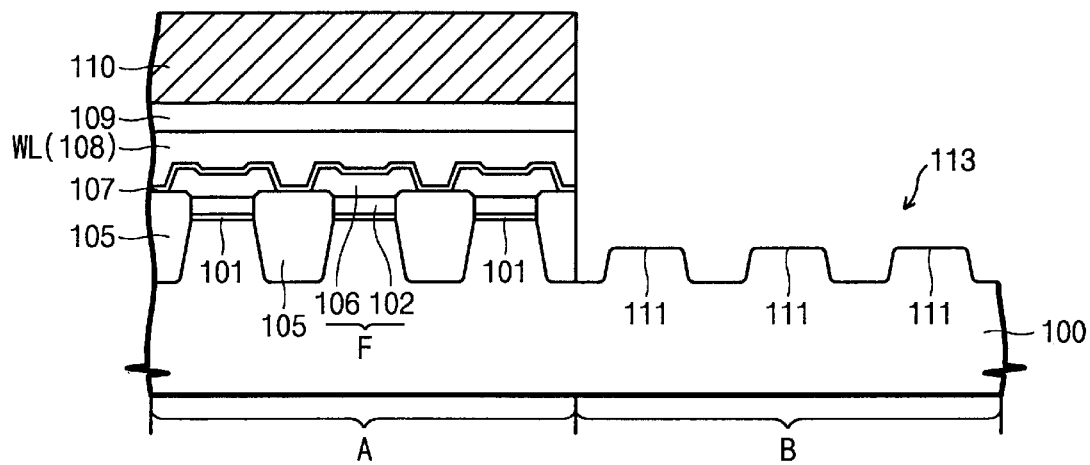
Figure 9B:
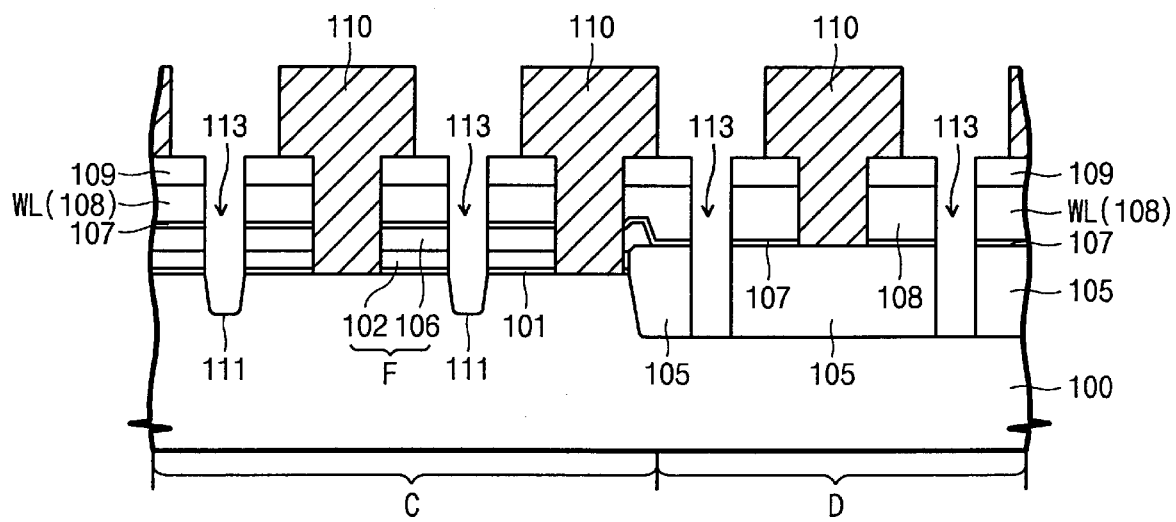

Referring to FIGS. 9A and 9B, the field oxide layers 105 between the source trenches 111 are etched by using the photo resist pattern 110 and the word lines WL as an etch mask. Thus, a common source line region 113 in which the semiconductor substrate 100 is exposed along one direction is formed self-aligned with the respective word lines WL, i.e., extending along one sidewall of the word lines WL. As a result, the surface of the source line 113 exposing the semiconductor substrate 100 is formed without severe steps shown in the conventional art.

Figure 10A:
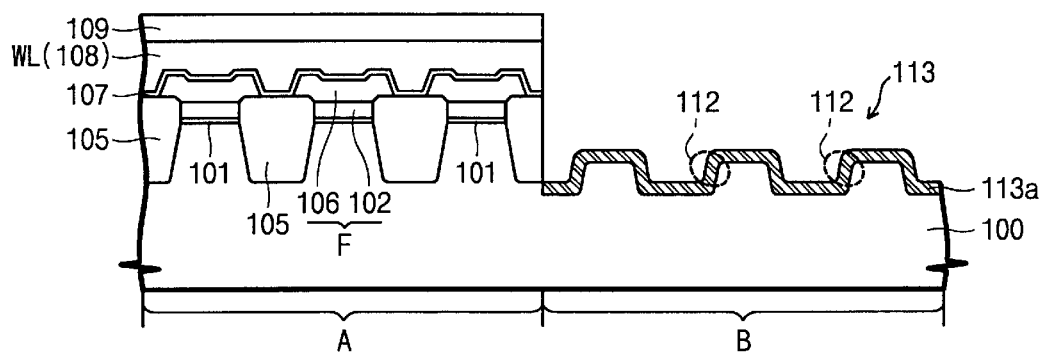
Figure 10B:
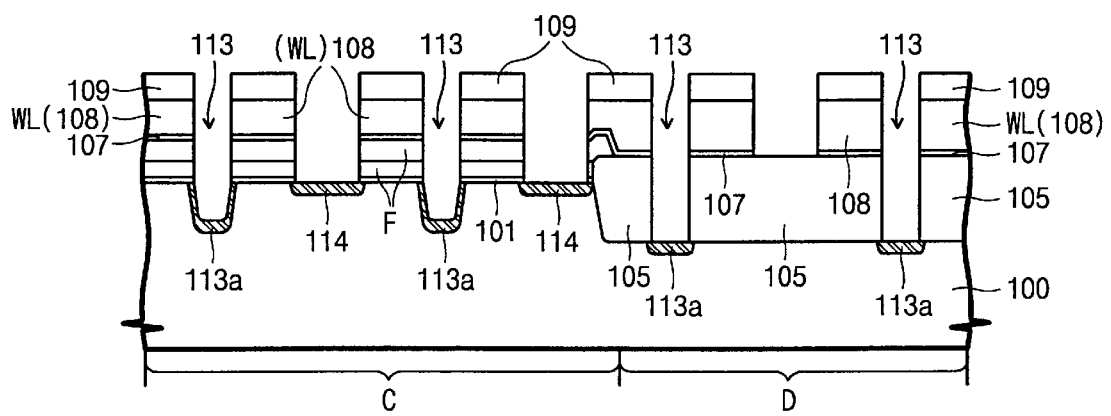

Referring to FIGS. 10A and 10B, after removing the photo resist pattern 110, impurities are implanted into the common source line region 113 and active regions separated by the field oxide layer along the other sidewall of the respective word lines WL. Thus, a common source line 113a made of an impurity diffusion layer along the one sidewall of the respective word lines WL is formed and concurrently a drain region 114 electrically insulated by the field oxide layer 105 along the other sidewall of the respective word lines WL is formed. Here, it is preferable to perform an ion implantation process using the oblique ion implantation in order to easily implant ions into the stepped sidewall 112 over the surface of the common source line 113a. As a result, the impurity diffusion layer formed on the stepped sidewall 112 of the common source line 113a is formed deeper than that of the conventional flash memory cell. In the ion implantation process, it is preferable to form the impurity diffusion layer by implanting phosphorus (P), arsenic (As), or antimony (Sb) in case of N-cannel metal oxide semiconductor (NMOS), with a dose of $1 \times 10^{15} \sim 1 \times 10^{16}$ ions/cm$^2$. In addition, it is preferable to cure damage to the semiconductor substrate 100 generated in forming the common source line 113 by forming a thermal oxidation film on the semiconductor substrate 100 before or after forming the impurity diffusion layer.

Figure 11A:
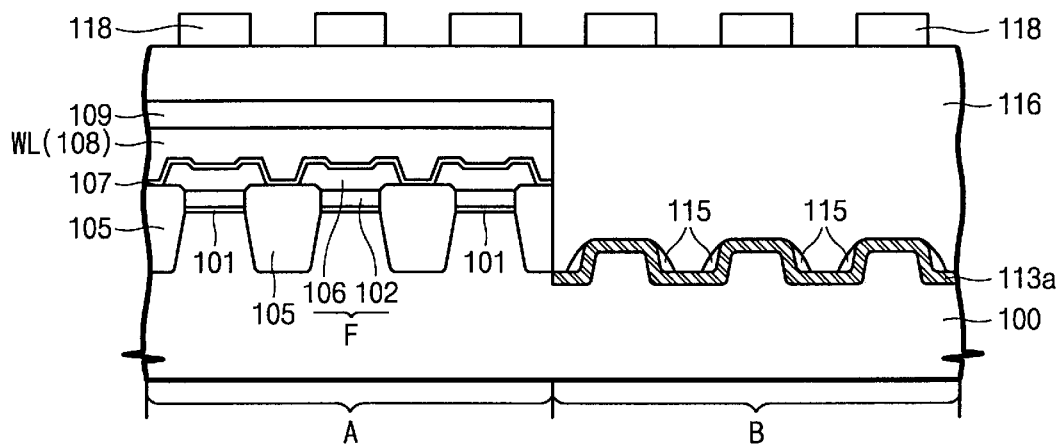
Figure 11B:
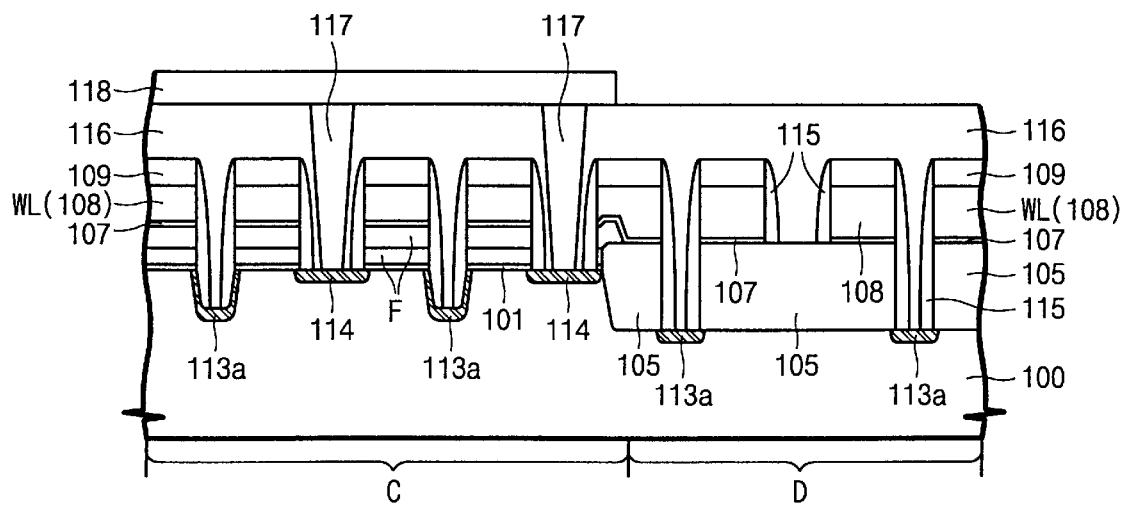

Referring to FIGS. 11A and 11B, an interlayer insulating film 116 and an interconnection are formed over the common source line 113a and the drain region 114 using conventional techniques. A sidewall spacer 115 of the word lines WL is formed during the formation of a lightly doped drain (LDD) structure for a peripheral circuit. A bit line 118 electrically connected to the drain region 114 through a contact plug 117 is formed for interconnection. Even though it is not shown, a contact plug electrically connected to an external interconnection is formed in the common source line 113 at regular intervals.

Figure 12:
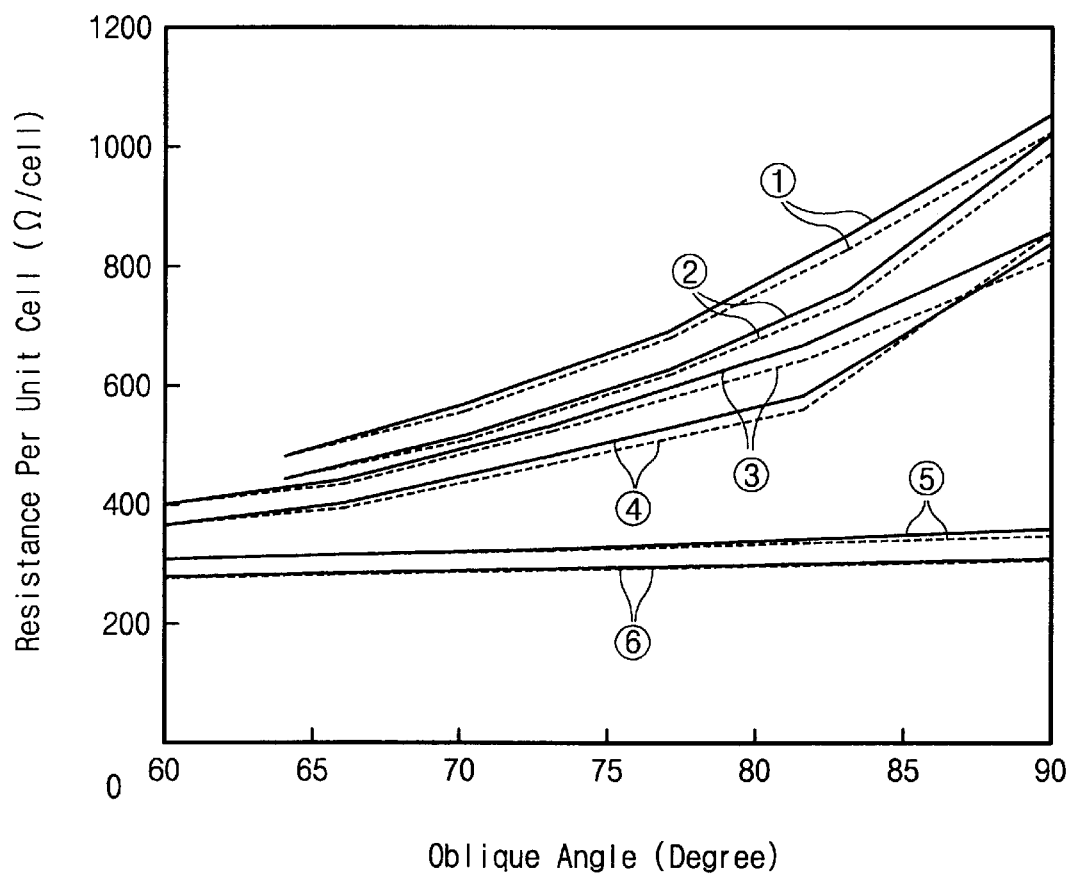
FIG. 12 is a graph showing diffusion resistance per unit cell as a function of inclination and height of a stepped sidewall of a common source line surface.

FIG. 12 is a graph showing resistance of source diffusion per unit cell as a function of an inclination and height of the stepped sidewall 112 on a surface of the common source line 113 shown in FIG. 10A.

It shows a variation of resistance values on the common source line, being measured by a simulation processor, after forming a memory cell array. The horizontal axis represents the oblique angle (θ) to a surface of the semiconductor substrate of the stepped sidewall 112 shown in FIG. 10A of the common source line, and the vertical axis represents the resistance per unit cell (Ω/cell). The resistance of the common source line is calculated by dividing the resistance of the common source line of 0.25 μm in width and 6.72 μm in height that is shared by 16 cell transistors by the number of cells. The height of the stepped sidewall 112 shown in FIG. 10A of the common source line is simulated to 0.26 μm for plots ① and ②, 0.21 μm for plots ③ and ④, and 0.10 μm for plots ⑤ and ⑥. The impurity diffusion layer of the common source line is ion-implanted using As under conditions of acceleration voltage of 30 Kev, and a dose of $2.0 \times 10^{15}$ atoms/cm$^2$ for the plots ①, ③, and ⑤. And conditions of the plots ②, ④, and ⑥ are acceleration voltage of 30 Kev, and a dose of $2.0 \times 10^{15}$ atoms/cm$^2$ for the plots. Further, the full line in the graph represents that an annealing process is performed in a temperature of 850° C. for 30 minutes after implanting the impurity for forming the common source line. The dotted line represents that the annealing process is performed in a temperature of 850° C. for 40 minutes. As shown in FIG. 12, when the inclination and the height of the stepped sidewall of the common source line are smaller and lower, the resistance value of the common source line is reduced.

As described above, the present invention can reduce an electric resistance of a common source line by forming an impurity diffusion layer with the oblique ion implantation after forming a surface of the common source line to be even or to have lower step difference compared to the prior art. As a result, it is possible to improve the speed of a NOR flash memory device, and to manufacture a NOR flash memory device having uniform device operational characteristics over an entire cell array.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method for fabricating a NOR flash memory device, the method comprising:
    forming adjacent isolation layers that define an active region therebetween within a semiconductor substrate;
    forming a floating gate pattern overlying the active region;
    sequentially forming an inter-gate dielectric film and a control gate film, overlying the floating gate pattern;
    sequentially patterning the control gate film, the inter-gate dielectric film, and the floating gate pattern, thereby forming a plurality of word lines extending across the active region, the word lines each having sidewalls;
    forming a photo resist pattern exposing the active region and the isolation layers along one sidewall of the word line;
    etching the exposed active region, using the photo resist pattern, the word lines, and the exposed isolation layers as an etch mask;

removing the exposed isolation layers, using the photo resist pattern and the word lines as an etch mask, to form a common source line region; and removing the photo resist pattern; and implanting impurities in the common source line region, thereby forming a common source line made of an impurity diffusion layer.

2. The method of claim 1, wherein forming the floating gate pattern further comprises:

forming a lower floating gate pattern self-aligned with the adjacent isolation layers, the lower floating gate pattern overlying a tunnel oxide film formed in the active region;

forming an upper floating gate film on the lower floating gate pattern; and patterning the upper floating gate film to form an upper floating gate pattern on the lower floating gate pattern, thereby forming the floating gate pattern.

3. The method of claim 2, wherein the lower floating gate pattern is made of polysilicon.

4. The method of claim 2, wherein the upper floating gate film is made of doped polysilicon.

5. The method of claim 2, wherein the upper floating gate film is made of polysilicon doped with an ion-implantation method.

6. The method of claim 4, wherein the upper floating gate film is doped with phosphorus or arsenic.

7. The method of claim 1, wherein a sidewall of the isolation layers is sloped.

8. The method of claim 1, wherein the surface of the semiconductor substrate is etched to a depth of approximately 500 Å to 2000 Å.

9. The method of claim 1, wherein the common source line region has sloped sidewalls self-aligned with the word line.

10. The method of claim 1, wherein the photo resist pattern is formed overlying the word line, the photo resist pattern exposing an edge of top of the word line.

11. The method of claim 1, the method further comprising forming a thermal oxidation film on the common source line region.

12. The method of claim 1, wherein the common source line and a drain region are concurrently formed by implanting impurities with an oblique ion implantation method.

13. The method of claim 12, wherein an angle of ion implantation in the oblique ion implantation method is approximately 30° through 45° to a plane of the semiconductor substrate surface.

14. The method of claim 1, wherein the common source line region is ion-implanted with an impurity selected from the group consisting of phosphorus (P), arsenic (As), and antimony (Sb).

15. The method of claim 14, wherein the impurities are implanted at a dose of $1\times10^{15}$~$1\times10^{16}$ ions/cm$^2$.

16. The method of claim 1, wherein the control gate film comprises doped polysilicon.

17. The method of claim 1, wherein the control gate film is formed by stacking a doped polysilicon layer and a metal silicide layer.

\* \* \* \* \*

UNITED STATES PATENT AND TRADEMARK OFFICE
CERTIFICATE OF CORRECTION

PATENT NO. : 6,635,532 B2  Page 1 of 1
DATED : October 21, 2003
INVENTOR(S) : Song et al.

It is certified that error appears in the above-identified patent and that said Letters Patent is hereby corrected as shown below:

Column 8,
Line 3, "500 ÅA to 2000 ÅA." should read -- 500 Å to 2000 Å. --.

Signed and Sealed this

Twenty-fifth Day of May, 2004

JON W. DUDAS
*Acting Director of the United States Patent and Trademark Office*